United States Patent [19]

Harwell

[11] 4,447,849
[45] May 8, 1984

[54] ELECTROMAGNETIC CONTROL CIRCUIT
[75] Inventor: Jack B. Harwell, Grapevine, Tex.
[73] Assignee: Teccor Electronics, Inc., Euless, Tex.
[21] Appl. No.: 394,437
[22] Filed: Jul. 1, 1982
[51] Int. Cl.³ .......................................... H03K 17/72
[52] U.S. Cl. .................................. 361/152; 361/205; 307/252 B
[58] Field of Search ................ 361/152, 205; 307/140, 307/252 R, 252 B, 252 N

[56] References Cited
U.S. PATENT DOCUMENTS 3,267,337  8/1966  Doyle et al. .................... 361/205 X
3,557,381  1/1971  Henry ............................... 307/252 B
4,333,019  6/1982  Weigert ........................... 361/205 X Primary Examiner—E. A. Goldberg
Assistant Examiner—Derek Jennings
Attorney, Agent, or Firm—Hubbard, Thurman, Turner & Tucker

[57] ABSTRACT

A control circuit is disclosed for limiting the polarity and duration of current flowing through an electromagnetic device which is coupled to an alternating current potential source. The control circuit is coupled in series with the electromagnetic device and a switch. The control circuit includes a gate controlled conduction device and circuitry which is utilized to selectively gate that device only during one positive half cycle following the closing of the switch. A second gate controlled conduction device is utilized to discharge a capacitor in timed relationship with the alternating current potential source and prevent recharging of that capacitor until the switch is opened and then closed again.

8 Claims, 1 Drawing Figure

ELECTROMAGNETIC CONTROL CIRCUIT

BACKGROUND OF THE INVENTION

This invention relates to circuits for controlling conduction through electromagnetic devices in general and in particular to circuits which permit a limited duration unipolar current to flow through an electromagnetic device coupled to an alternating current potential source.

There has existed for some time the need for portable tools which utilize a single power stroke, such as nailers; staplers; stud drivers; riveters; punches; chisels; and, tackers. In the past, one solution to providing power to such single stroke tools has been the use of pneumatic or hydraulic power. While such a solution has been fairly satisfactory in that large amounts of power can be generated and applied utilizing fluid or gas pressure, their utilization has been limited to those applications in which the amount of use will justify the expense of maintaining and supplying compression facilities.

While an electrically operated tool of the single stroke type would be generally advantageous due to the wide availability of electrical power, the necessity of providing a single power stroke raises certain difficulties in implementation. One previously known approach to providing a single power stroke is the utilization of a rotating electric motor to compress a spring which may be released to drive the stroking portion of the tools. Such springs are subject to fatigue and the mass of electric motor required to stress and release such a spring has made such tools unwieldy and difficult to operate. Another attempt at an electrically powered single stroke tool has utilized a fairly complex electronic circuit and a gate controlled conduction device to limit the polarity and duration of current through an electromagnetic winding; however, these known circuits are less dependable and present possible safety problems within the environment of a hand-held power tool.

SUMMARY OF THE INVENTION

It is therefore an object of the present invention to provide an improved control circuit for controlling the polarity and duration of current through an electromagnetic device.

It is another object of the present invention to provide an improved control circuit for controlling the current through an electromagnetic device which may be simply and easily coupled in series with the electromagnetic device and a switching device.

It is yet another object of the present invention to provide an improved electromagnetic control circuit for controlling the duration and polarity of current through an electromagnetic device which may be safely and inexpensively implemented in a portable electric tool.

The foregoing objects are achieved as is now described. The control circuit is coupled in series with the electromagnetic device and a switch. The control circuit is comprised of a gate controlled conduction device and circuitry which is utilized to selectively gate that device only during one positive half cycle following the closing of the switch. A second gate controlled conduction device is utilized to discharge a capacitor in timed relationship with the alternating current potential source and prevent recharging of that capacitor until the switch is opened and then closed again.

BRIEF DESCRIPTION OF THE DRAWINGS

The novel features believed characteristic of the invention are set forth in the appended claims. The invention itself; however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
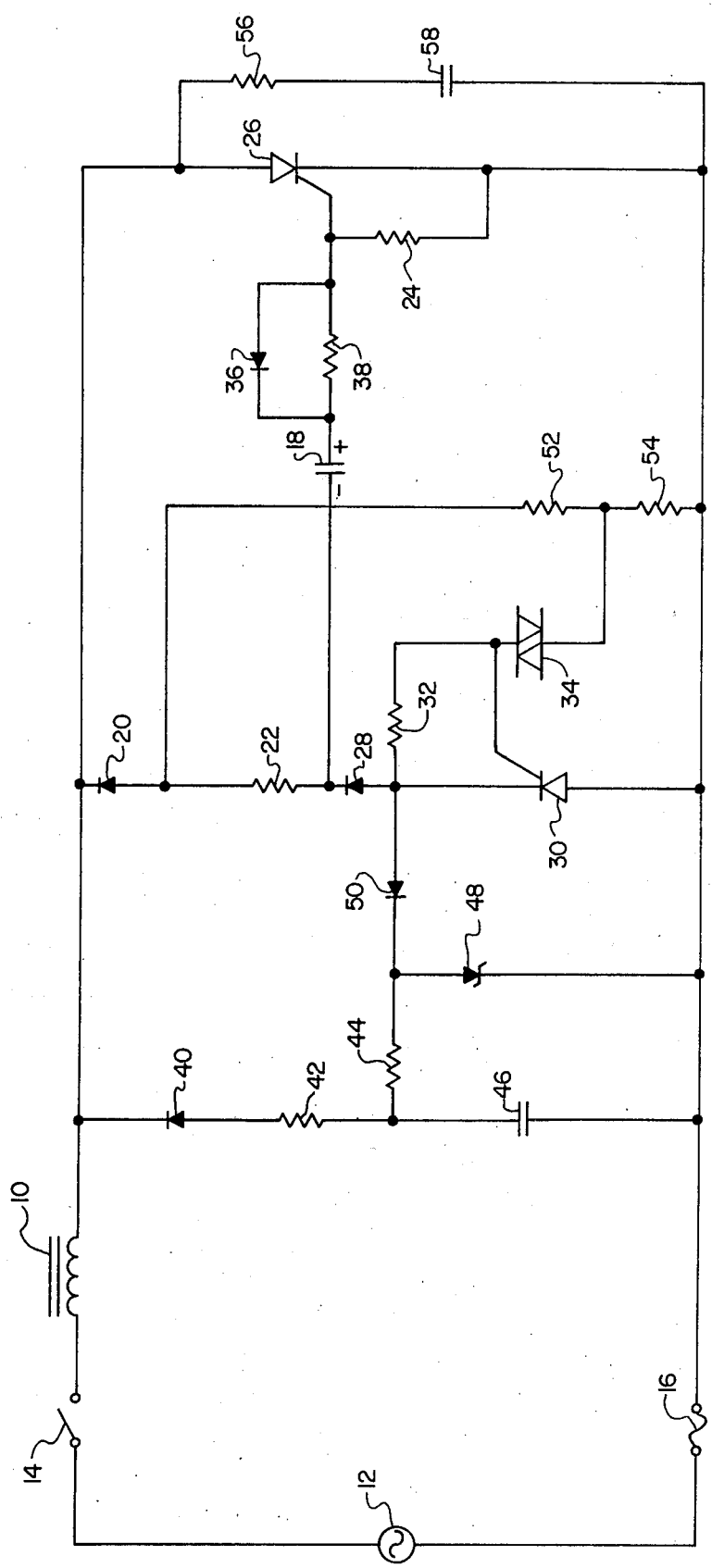
FIG. 1 is a schematic diagram of the improved electromagnetic control circuit of the present invention.

With reference now to FIG. 1, there is depicted a schematic diagram of the improved electromagnetic control circuit of the present invention. An electromagnetic winding 10, such as is commonly utilized as the motive force in portable electric staplers, tackers or the like is shown coupled in series with an alternating current potential source 12 and a normally open, single pole, single throw switch 14, which is utilized to complete the circuit and apply alternating current potential to electromagnetic winding 10. A fuse 16 is also present in the circuit in a preferred embodiment and is utilized to provide protection from an unsafe condition which may result due to failure of one of the control circuit components. Those ordinarily skilled in the art will appreciate that switch 14 may, in an alternate embodiment, be coupled in series between source 12 and fuse 16.

After switch 14 has closed, capacitor 18 will begin to charge during the first negative half cycle of alternating current potential source 12. Capacitor 18 will only charge during negative half cycles due to the presence of diode 20. The charge path of capacitor 18 is through electromagnetic winding 10, diode 20, resistor 22, diode 36 and the parallel path formed by resistor 24 and the gate of power silicon controlled rectifier 26. In a preferred embodiment, the charging time constant of capacitor 18 is chosen to ensure that capacitor 18 will not reach a sufficiently high voltage to trigger operation until after several line cycles have occurred. This delay will ensure that switch 14 has completely closed and is providing a firm conduction path for the load current.

The negative side of capacitor 18 is coupled by way of diode 28 to silicon controlled rectifier 30 and through diode 28 and resistor 32 to one side of diac 34. As the charge on capacitor 18 exceeds the diac voltage, diac 34 will conduct, silicon controlled rectifier 30 will be gated on and capacitor 18 will discharge through diode 28, silicon controlled rectifier 30, resistor 38 and the parallel path of resistor 24 and the gate cathode circuit of power silicon controlled rectifier 26.

To ensure that silicon controlled rectifier 30 remains in conduction until switch 14 is open, a small power supply is included to provide an adequate holding current for silicon controlled rectifier 30. Diode 30, resistors 42 and 44 and capacitor 46 form such a power supply. Zener diode 48 is provided to ensure that the holding current power supply does not generate sufficient voltage to trigger diac 34 prematurely. Diode 50 acts with diode 28 to ensure that the holding current power supply does not affect the charging and discharging of capacitor 18. Thus, so long as silicon controlled rectifier 30 remains in conduction, capacitor 18 cannot recharge.

It is necessary to control the discharge of capacitor 18 to ensure that sufficient gate current is provided to power silicon controlled rectifier 26 to ensure that power silicon controlled rectifier 26 will trigger during the next positive half cycle after silicon controlled rectifier 30 has triggered. Recalling that capacitor 18 charges during negative half cycles of alternating current potential source 12, thereby increasing the voltage on diac 34, those skilled in the art will appreciate that diac 34 must trigger at some time during a negative half cycle, initiating the discharge of capacitor 18. If diac 34 is triggered too soon after the beginning of a negative half cycle, it is possible that capacitor 18 may discharge beyond the point where sufficient charge remains to trigger power silicon controlled rectifier 26 at the beginning of the succeeding positive half cycle. Thus, to ensure proper operation of silicon controlled rectifier 26, it is necessary to ensure that diac 34 does not trigger until near the end of a negative half cycle. To that end, resistors 52 and 54 act with diode 20 to place a negative bias voltage on one side of diac 34. This bias voltage ensures that diac 34 will not fire until near the end of a negative half cycle.

In summary, the negative charge on capacitor 18 is utilized to trigger diac 34 near the end of a negative half cycle of alternating current potential source 12. The conduction of diac 34 will trigger the conduction of silicon controlled rectifier 30 which will in turn discharge capacitor 18. The discharge of capacitor 18 will trigger power silicon controlled rectifier 26 during the next positive half cycle of alternating current potential source 12. The snubber network comprised of resistor 56 and capacitor 58 will serve to limit the maximum rate of voltage change across power silicon controlled rectifier 30 to an upper limit calculated to prevent premature and unwanted triggering. Silicon controlled rectifier 30 will discharge capacitor 18 at a rate sufficient to ensure that power silicon controlled rectifier 26 cannot trigger on succeeding positive half cycles. Once switch 14 has been reclosed, capacitor 18 may then recharge to a level sufficient to once again trigger diac 34.

Unlike prior known control circuits for limiting the polarity and duration of current through an electromagnetic device which is coupled to an alternating current potential source, the control circuit of the present invention is simple and easily connected between a switch and any electromagnetic device. The necessity of making only two wire connections with an existing electromagnetic device and switch circuit renders the improved control circuit of the present invention highly advantageous and economical to utilize.

Further, the circuit disclosed herein demonstrates a higher level of safety due to a lack of unwanted firing in event of circuit failure. In the event of triac failure in known circuits, the electromagnetic device would be unrestrained in operation. By utilizing the novel circuit of the present invention, and placing the control circuit in series with switch 14, triac failure will not operate the device unless switch 14 is closed.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. An electromagnetic control circuit comprising:
   an electromagnetic winding means adapted to be coupled in series with an alternating current potential source;
   switch means adapted to be coupled in series with said electromagnetic winding means and said alternating current potential source; and
   control means coupled in series with said electromagnetic winding means and said switch means, said control means for controlling the conduction of current through said electromagnetic winding means, said control means comprising:
   a gate controlled conduction device;
   capacitive means coupled to the gate of said gate controlled conduction device;
   means for charging said capacitive means during a negative half cycle of said alternating current potential source after the closing of said switch means; and
   means for discharging said capacitive means through the gate of said gate controlled conduction device, in timed relationship with said alternating current potential source wherein said gate controlled conduction device is placed into a conductive state only during a positive half cycle after the closing of said switch means.

2. The electromagnetic control circuit according to claim 1 wherein said means for discharging said capacitive means comprises a second gate controlled conduction device coupled to said capacitive means and a diac coupled to the gate of said second gate controlled conduction device and said capacitive means.

3. The electromagnetic control circuit according to claim 1 wherein said switch means comprises a normally open, single pole, single throw switch.

4. The electromagnetic control circuit according to claim 1 wherein said gate controlled conduction device comprises a silicon controlled rectifier.

5. In a portable electric tool adapted to be coupled to an alternating current potential source and having an electromagnetic winding and a trigger switch, a control circuit coupled in series with said electromagnetic winding and said trigger switch for controlling the polarity and duration of the current through said electromagnetic winding, said control circuit comprising:
   a gate controlled conduction device;
   capacitive means coupled to the gate of said gate controlled conduction device;
   means for charging said capacitive means during a negative half cycle of said alternating current potential source after the closing of said trigger switch; and
   means for discharging said capacitive means through the gate of said gate controlled conduction device, in timed relationship with said alternating current potential source wherein said gate controlled conduction device is placed into a conductive state only during a positive half cycle after the closing of said trigger switch.

6. The electromagnetic control circuit according to claim 5 wherein said means for discharging said capacitive means comprises a second gate controlled conduction device coupled to said capacitive means and a diac coupled to the gate of said second gate controlled conduction device and said capacitive means.

7. The electromagnetic control circuit according to claim 5 wherein said trigger switch comprises a normally open, single pole, single throw switch.

8. The electromagnetic control circuit according to claim 5 wherein said gate controlled conduction device comprises a silicon controlled rectifier.

* * * * *